(12) United States Patent
Myung (10) Patent No.: US 7,638,384 B2
(45) Date of Patent: Dec. 29, 2009

(54) METHOD OF FABRICATING A SEMICONDUCTOR DEVICE

(75) Inventor: Jung Hak Myung, Gyeonggi-do (KR)

(73) Assignee: Dongbu HiTek Co. Ltd., Seoul (KR)

( * ) Notice: Subject to any disclaimer, the term of this patent is extended or adjusted under 35 U.S.C. 154(b) by 134 days.

(21) Appl. No.: 11/616,285

(22) Filed: Dec. 26, 2006

(65) Prior Publication Data

US 2007/0166976 A1  Jul. 19, 2007

(30) Foreign Application Priority Data

Dec. 29, 2005  (KR) .................. 10-2005-0133888

(51) Int. Cl.
*H01L 21/8238* (2006.01)

(52) U.S. Cl. .................. 438/199; 438/151; 438/211; 438/735; 438/736; 438/655; 438/664; 438/682; 257/E21.199; 257/E21.438

(58) Field of Classification Search ................ 438/151, 438/199, 211, 655, 664, 682, 735, 736; 257/E21.199, 257/E21.438
See application file for complete search history.

(56) References Cited

U.S. PATENT DOCUMENTS

| 6,043,545 | A  | * | 3/2000  | Tseng et al. ........... 257/408 |
| 6,162,691 | A  | * | 12/2000 | Huang ................... 438/300 |
| 6,169,017 | B1 | * | 1/2001  | Lee ....................... 438/585 |
| 2001/0019156 | A1 | * | 9/2001 | Matsuo et al. ......... 257/368 |
| 2004/0132274 | A1 | * | 7/2004 | Jun et al. ............... 438/592 |

\* cited by examiner

*Primary Examiner*—Thanh V Pham
(74) *Attorney, Agent, or Firm*—Sherr & Vaughn, PLLC

(57) ABSTRACT

Embodiments relate to a method of fabricating a semiconductor device. In embodiments, a gate pattern may be formed on a semiconductor substrate, and sidewalls having a lower height than a height of the gate pattern may be formed at both sides of the gate pattern using a photoresist pattern. A silicide layer may be formed on exposed upper surface and side surfaces of the gate pattern and a portion of the semiconductor substrate at both sides of the sidewalls. Therefore, the silicide layer formed on a gate may be enlarged, and may reduce gate resistance.

9 Claims, 8 Drawing Sheets

METHOD OF FABRICATING A SEMICONDUCTOR DEVICE

The present application claims priority under 35 U.S.C. 119 and 35 U.S.C. 365 to Korean Patent Application No. 10-2005-0133888 (filed on Dec. 29, 2005), which is hereby incorporated by reference in its entirety.

BACKGROUND

Resistance of a gate electrode may be an important factor in determining an operational speed of a semiconductor device. To reduce resistance of a poly gate electrode, for example, a silicide layer may be formed on the poly gate electrode.

FIGS. 1A to 1G are example sectional diagrams illustrating a method of fabricating a related art semiconductor device.

Figure 1A:
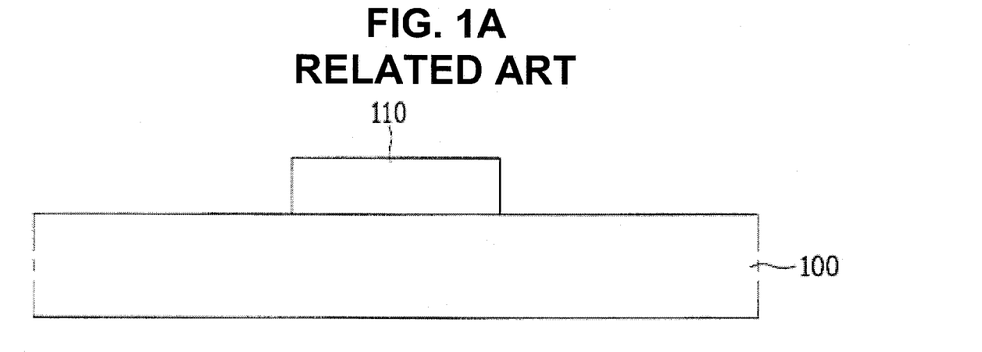
FIGS. 1A to 1G are example sectional diagrams illustrating a related art method of fabricating a semiconductor device.

Referring to FIG. 1A, a gate electrode material such as polysilicon may be formed on silicon substrate 100, and gate electrode material may be etched using a photoresist pattern as a mask. The photoresist pattern may be removed and a cleaning process may be performed thereon to form gate electrode 110.

Figure 1B:
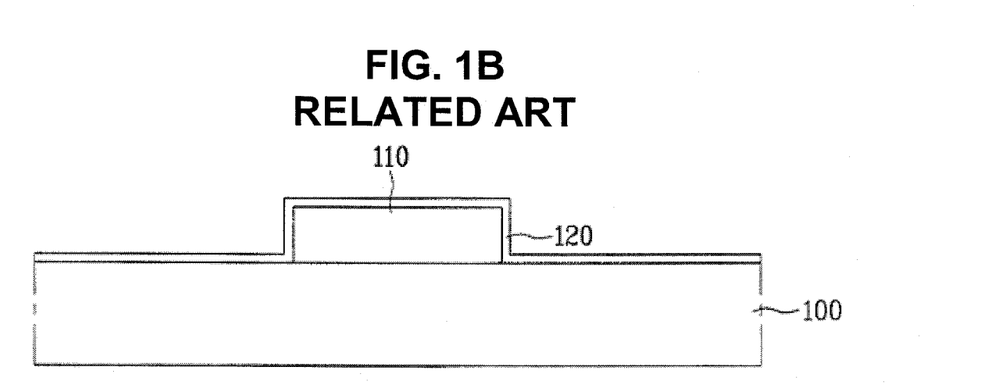

Referring to FIG. 1B, poly oxide layer 120 may be formed on a surface, for example the entire upper surface, of silicon substrate 100 including gate electrode 110. Poly oxide layer 120 may recover or correct damage caused by plasma generated during the etching process and may prevent damage that may be caused during an implant process that may be performed later. Such an implant process may be an ion implant process to form an N lightly doped drain (LDD).

Figure 1C:
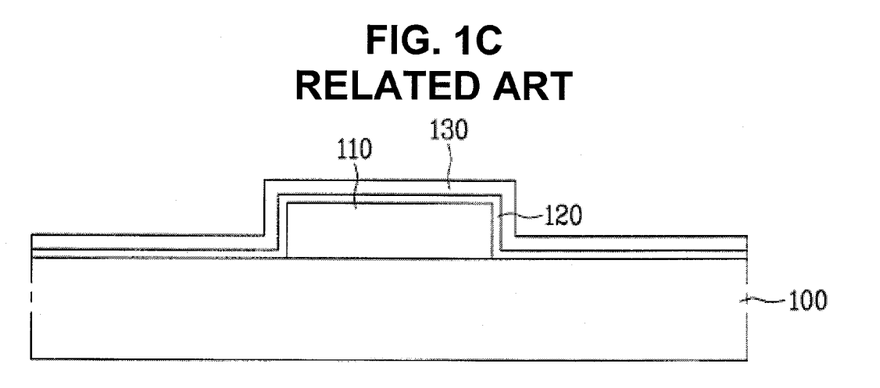

Referring to FIG. 1C, cap oxide layer 130 may be formed on poly oxide layer 120. Cap oxide layer 130 may serve as an etch stop layer, and may prevent damage caused by an implant process to be performed after the ion implant process for forming an N LDD. Such an implant process may include an ion implant process for forming a P LDD. Cap oxide layer 130 may also prevent damage caused during an etching process of a sidewall nitride. Cap oxide layer 130 may be formed using a tetra ethyl ortho silicate (TEOS).

Figure 1D:
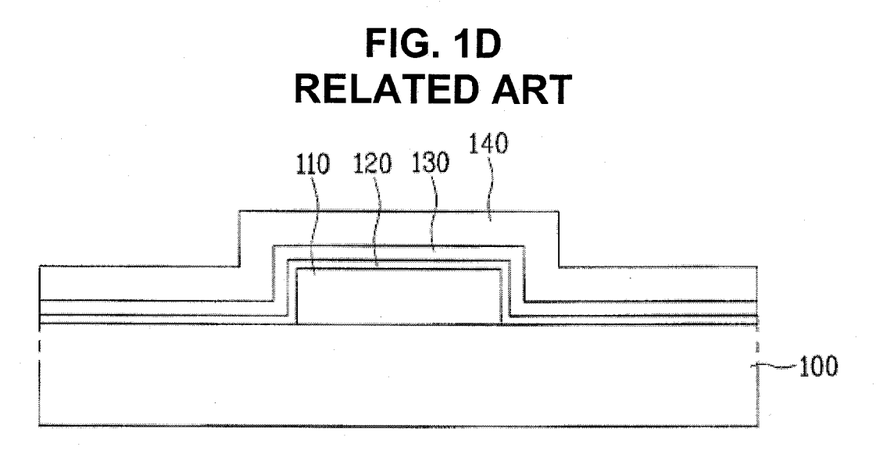

Referring to FIG. 1D, nitride layer 140 may be formed on a surface (for example, an entire upper surface) of cap oxide layer 130. Nitride layer 140 may be used to form sidewalls and may be formed using a deposition process.

Figure 1E:
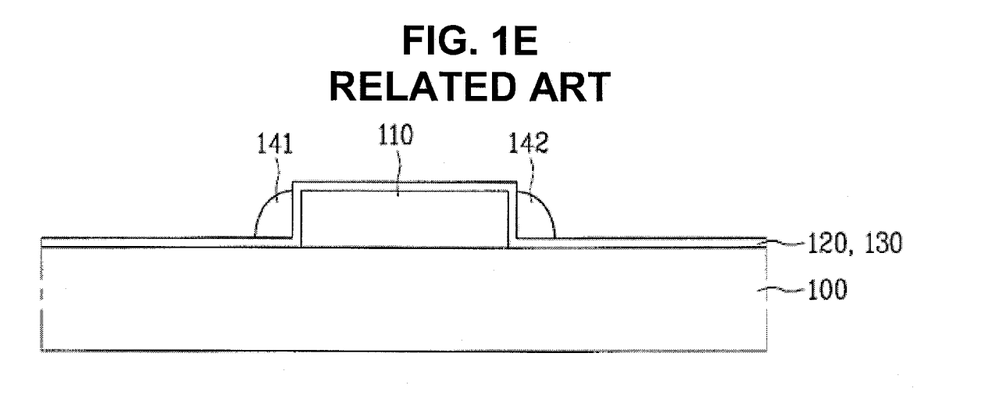

Referring to FIG. 1E, nitride layer 140 may be etched to form sidewalls 141 and 142 at both sides of gate electrode 110. A source/drain implant process may then be performed.

Figure 1F:
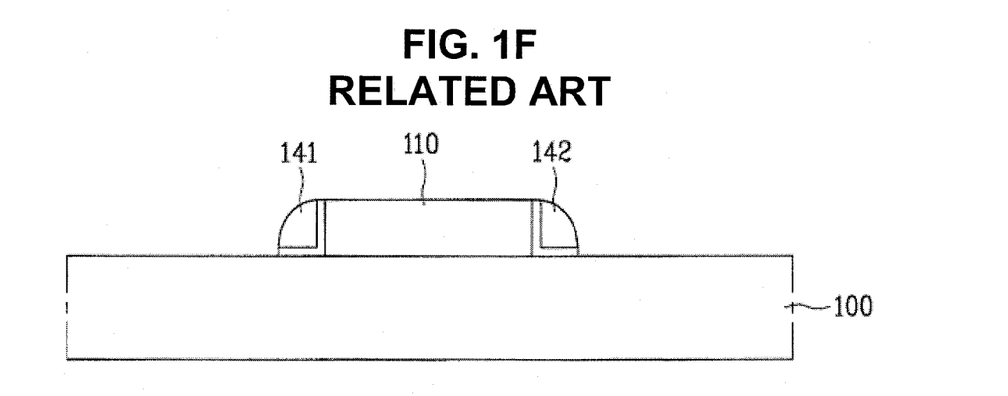

Referring to FIG. 1F, poly oxide layer 120 and cap oxide layer 130 on silicon substrate 100 and gate electrode 110 may be removed, for example using dry and wet etching processes. This may be done before forming a silicide layer having lower specific resistance than specific resistance of a poly gate on a surface of silicon substrate 100 and a surface of gate electrode 110 in order to reduce resistance of a poly gate.

Figure 1G:
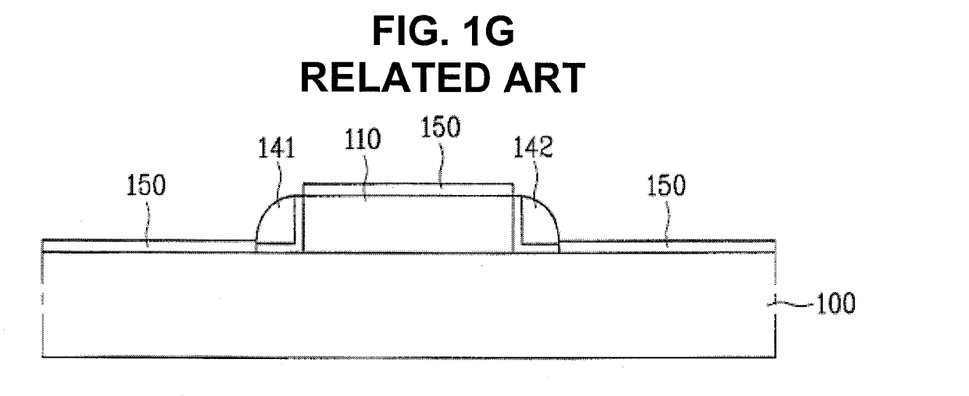

Referring to FIG. 1G, silicide layer 150 may be formed on an exposed surface of substrate 100 and an exposed surface of the gate electrode. Silicide layer 150 may be formed by depositing a metal layer such as a Co layer, a Ti layer, and/or a Ni layer on a surface of the structure illustrated in FIG. 1F, for example using a sputtering process and then performing a patterning process, a stripping process, a heat treatment process, and the like.

According to the above-mentioned method of related art, as a silicide layer having lower specific resistance than specific resistance of a poly gate may be formed on an exposed surface of a substrate and a gate, resistance of a poly gate may be reduced. However, since the silicide layer may be formed on only the upper surface of the gate, there may be a limitation in reducing resistance.

SUMMARY

Embodiments relate to a method of fabricating a semiconductor device. Embodiments relate to a method of fabricating a gate of a semiconductor device.

Embodiments relate a method of fabricating a semiconductor device capable of reducing gate resistance by enlarging a silicide layer formed on a gate.

According to embodiments, a method of fabricating a semiconductor device may include forming a gate electrode on a semiconductor substrate, forming an insulating layer on the semiconductor substrate including the gate electrode, forming height differences in both edge portions of the insulating layer, etching the insulating layer with the height differences to form sidewalls at both sides of the gate electrode, and forming a silicide layer on an exposed surface of the gate electrode and a portion of the semiconductor substrate at both sides of the side walls.

According to embodiments, forming of the height differences may include forming a photoresist pattern on the insulating layer, etching the insulating layer using the photoresist pattern as a mask, and removing the photoresist pattern.

According to embodiments, the photoresist pattern may expose only a portion of the insulating layer where the sidewalls may be formed.

According to embodiments, the photoresist pattern may include a first pattern that may be formed to have a width corresponding to a width of the gate electrode on the gate electrode and second patterns that are spaced apart from both sides of the first pattern by a width of the sidewalls.

According to embodiments, the insulating layer may be formed of a nitride.

According to embodiments, a semiconductor device may include a semiconductor substrate, a gate electrode formed on the semiconductor substrate, an oxide layer formed to a lower height than a height of the gate electrode at a side of the gate electrode, a sidewall formed on the oxide layer, and a silicide layer covering the semiconductor substrate and an upper surface and a portion of a side surface of the gate electrode.

According to embodiments, the oxide layer may include a poly oxide layer and a cap oxide layer.

DETAILED DESCRIPTION

Figure 2A:
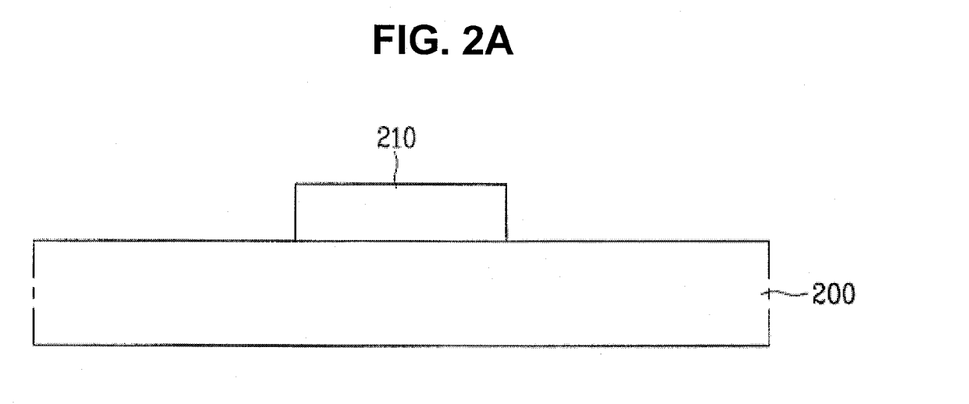
FIGS. 2A to 2I are example sectional diagrams illustrating a method of fabricating a semiconductor device according to embodiments.

Referring to FIG. 2A, a gate electrode material such as polysilicon may be formed on silicon substrate 200. The gate electrode material may be etched using a photoresist pattern as a mask. The photoresist pattern may be removed, and a cleaning process may be performed thereon to form gate electrode 210.

Figure 2B:
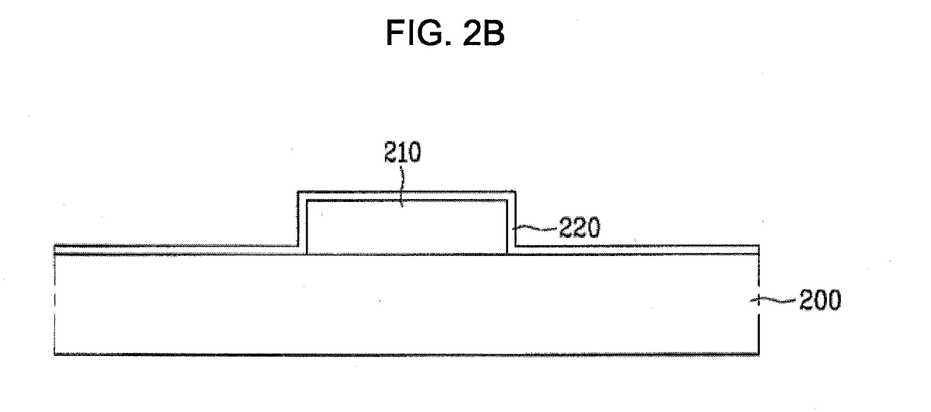

Referring to FIG. 2B, poly oxide layer 220 may be formed on a surface (for example, the entire upper surface) of silicon substrate 200, including gate electrode 210. Poly oxide layer 220 may correct or recover damage caused by plasma generated during the etching process. Poly oxide layer 220 may also prevent damage that may be caused during an implant process to be performed later. In embodiments, such an implant process may include an ion implant process for forming an N LDD.

Figure 2C:
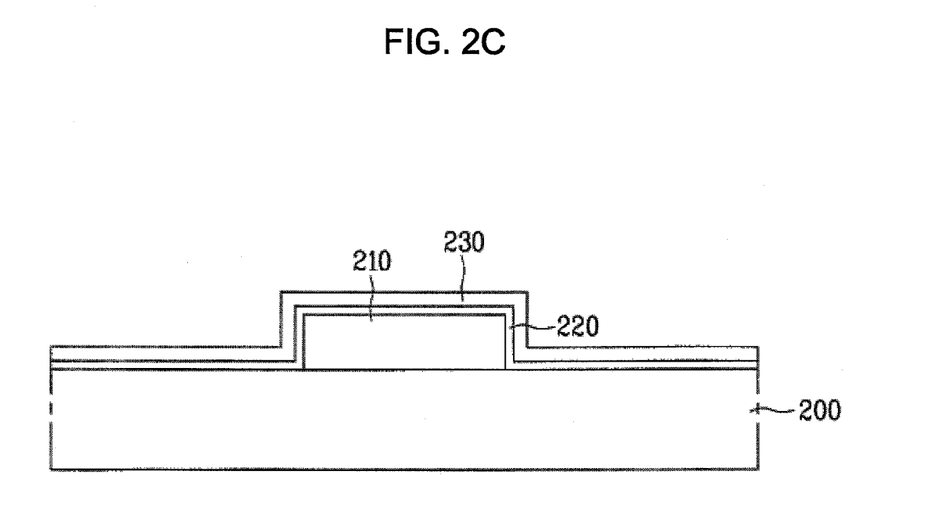

Referring to FIG. 2C, cap oxide layer 230 may be formed on poly oxide layer 220. Cap oxide layer 230 may serve as an etch stop layer and may prevent damage caused by an implant process that may be performed after the ion implant process for forming an N LDD, for example, an ion implant process for forming a P LDD. Cap oxide layer 230 may also prevent incidental damage caused during an etching process of a sidewall nitride. Cap oxide layer 230 may be formed using a tetra ethyl ortho silicate (TEOS)

Figure 2D:
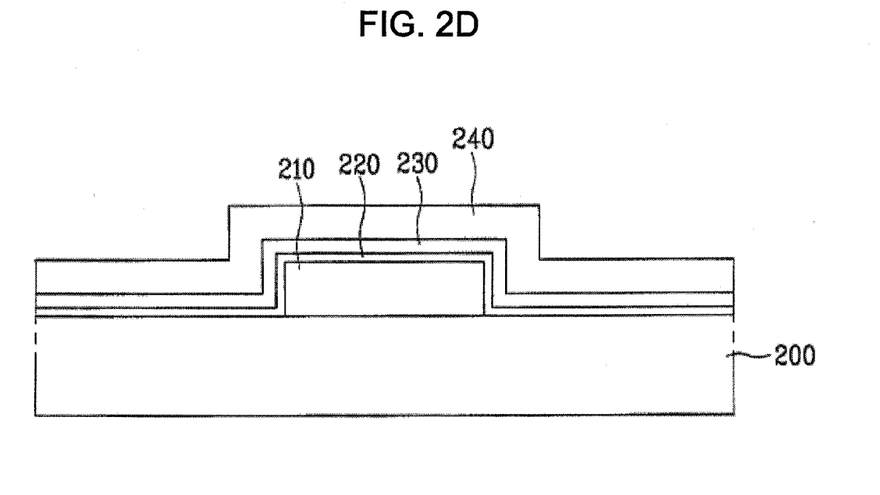

Referring to FIG. 2D, nitride layer 240, which may serve as an insulating layer, may be formed on a whole upper surface of cap oxide layer 230. Nitride layer 240 may be used to form sidewalls, and may be formed using a deposition process.

Figure 2E:
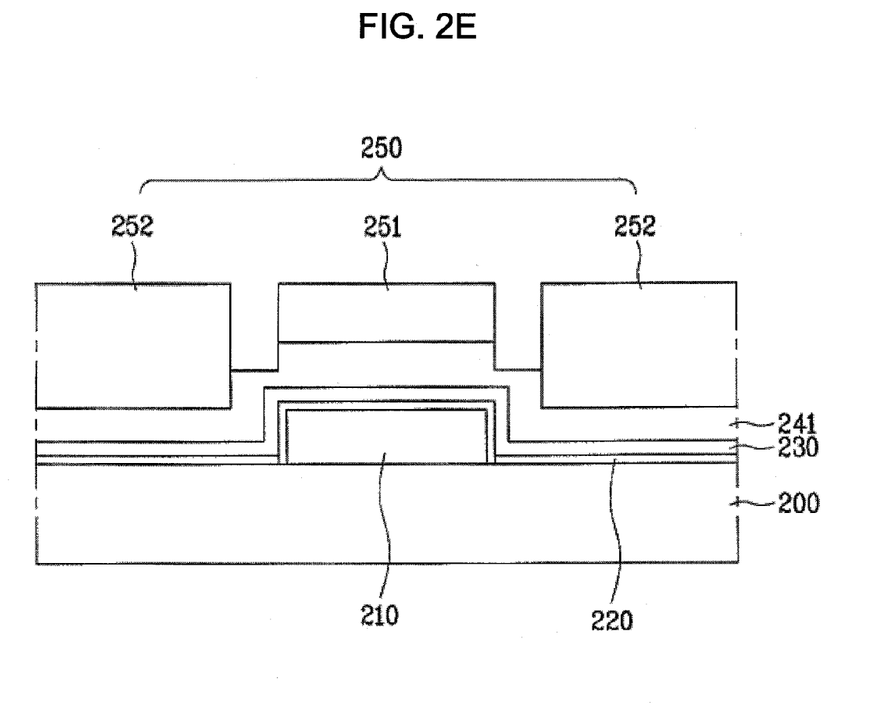

Referring to FIG. 2E, nitride layer 240 may be coated with a photoresist layer, and exposure and development processes may be performed thereon to form photoresist pattern 250. Photoresist pattern 250 may be formed to expose only portions of nitride layer 240 in which sidewalls may be formed. In embodiments, photoresist pattern 250 may include first pattern 251, which may be formed on gate electrode 210 to have a width corresponding to a width of gate electrode 210, and second patterns 252, which may be spaced apart from both sides of first pattern 251 by a width of the sidewalls. Next, the exposed portion of nitride layer 240 may be etched using photoresist pattern 250 as a mask to form height differences at edge portions of nitride layer 240.

Figure 2F:
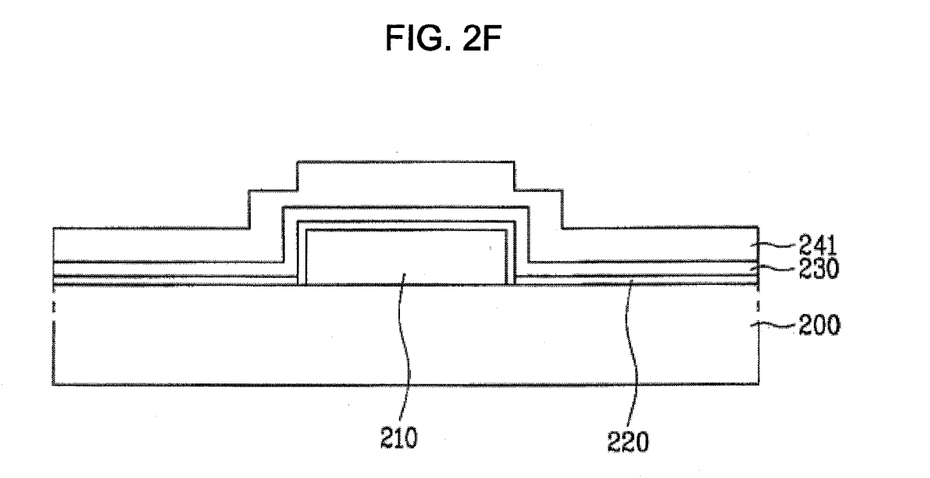

Referring to FIG. 2F, photoresist pattern 250 may be removed to expose nitride layer 241 with the height differences.

Figure 2G:
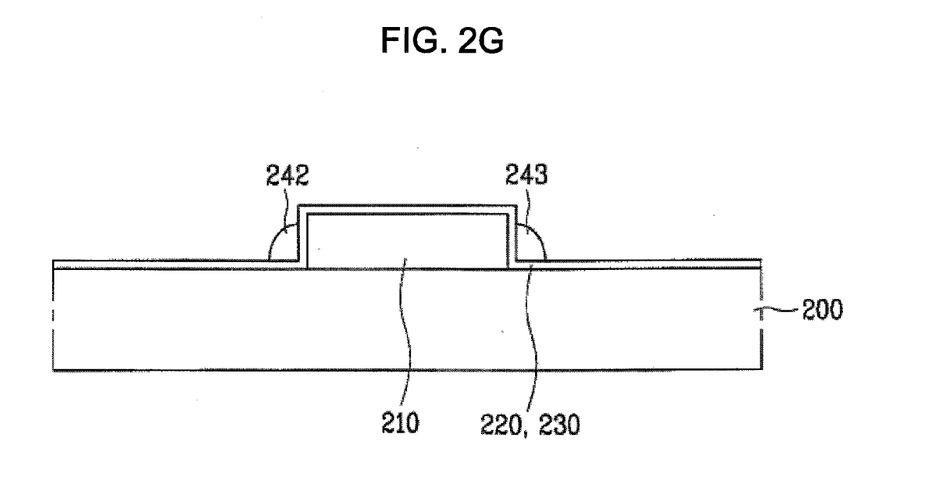

Referring to FIG. 2G, nitride layer 241 may be anisotropically etched to form sidewalls 242 and 243 at both sides of gate electrode 210. As nitride layer 241 is anisotropically etched, due to the height difference formed at both edge portions of nitride layer 241, a height of sidewalls 242 and 243 may be lower than a height of related art sidewalls and may have a same width as a width of related art sidewalls. Consequently, sidewalls 242 and 243 may be formed to a height lower than a height of gate electrode 210.

Figure 2H:
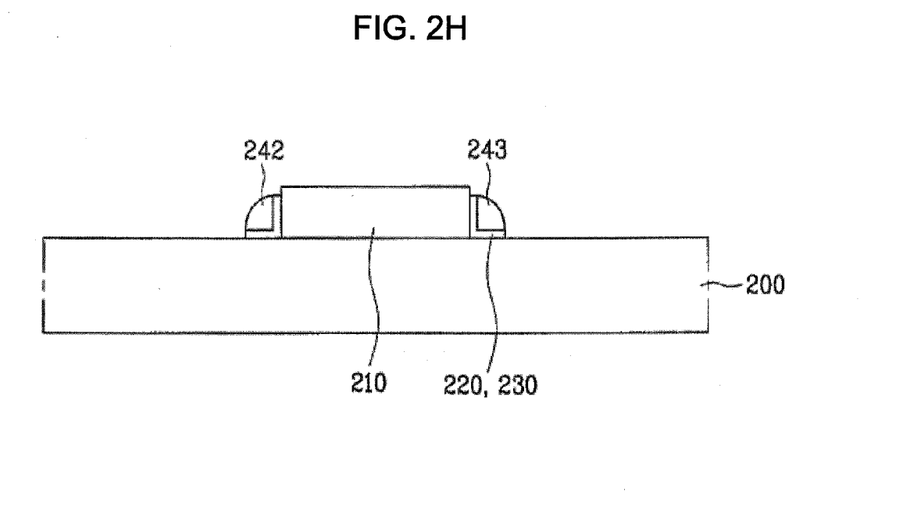

Referring to FIG. 2H, an exposed portion of poly oxide layer 220 and cap oxide layer 230, for example, poly oxide layer 220 and cap oxide layer 230 formed on an upper surface and an upper portion of side surfaces of gate electrode 210 and silicon substrate 200, may be removed using an etching process. Next, a portion where a silicide layer may be formed may be pre-cleaned using HF.

Figure 2I:
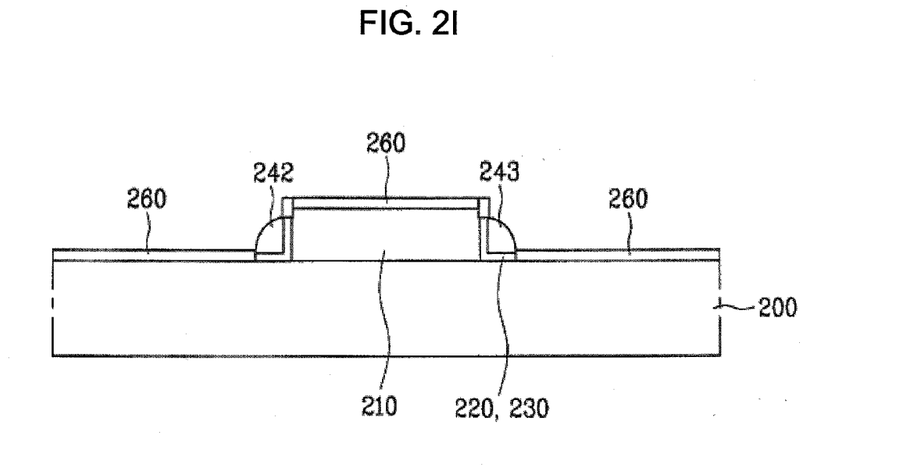

Referring to FIG. 2I, silicide layer 260 may be formed on an exposed portion of gate electrode 210, that is, an upper surface and an upper portion of side surfaces of gate electrode 210.

According to a method of fabricating a semiconductor device in embodiments, a silicide layer formed on a gate may be enlarged in both lateral directions, which may reduce gate resistance. This may improve an operational speed of the semiconductor device.

It will be apparent to those skilled in the art that various modifications and variations may be made to embodiments. Thus, it is intended that embodiments cover modifications and variations thereof within the scope of the appended claims. It is also understood that when a layer is referred to as being "on" or "over" another layer or substrate, it may be directly on the other layer or substrate, or intervening layers may also be present.

What is claimed is:

1. A method comprising:
   forming a gate electrode over a semiconductor substrate;
   forming an insulating layer over the semiconductor substrate including the gate electrode;
   forming height differences in portions of the insulating layer over edge areas of the gate electrode;
   etching the insulating layer with the height differences to form sidewalls at both sides of the gate electrode; and
   forming a silicide layer over the gate electrode and a portion of the semiconductor substrate at both sides of the sidewalls,
   wherein said forming height differences comprises:
   forming a photoresist pattern over the insulating layer;
   etching the insulating layer using the photoresist pattern as a mask; and
   removing the photoresist pattern, wherein the photoresist pattern comprises a first pattern that is formed to have a width corresponding to a width of the gate electrode on the gate electrode and second patterns that are spaced apart from both sides of the first pattern by a width of the sidewalls.

2. The method of claim 1, wherein the sidewalls have a height lower than a height of the gate.

3. The method of claim 1, further comprising forming a silicide layer on a top portion of the sidewalls so as to have a top layer in a same plane as the suicide layer over the gate electrode.

4. The method of claim 3, wherein a combined width of the silicide layer on the top portion of the sidewalls and the gate electrode is greater than a width of the gate electrode.

5. The method of claim 1, wherein the photoresist pattern is configured to expose only a portion of the insulating layer where the sidewalls are formed.

6. The method of claim 1, wherein the insulating layer with the height differences comprises a first height over the gate electrode, a second height over the semiconductor substrate adjacent to the gate electrode having a width of the sidewalls, and a third height over the semiconductor substrate beyond the width of the sidewalls.

7. The method of claim 6, wherein the first height is greater than the second height, and wherein the second height is greater than the third height.

8. The method of claim 1, wherein the insulating layer comprises a nitride.

9. The method of claim 8, where the insulating layer further comprises an oxide layer formed directly adjacent to the gate electrode, and the nitride formed on the oxide layer.

* * * * *